United States Patent [19]
Kawabata

[11] Patent Number: 5,537,113
[45] Date of Patent: Jul. 16, 1996

[54] A/D OR D/A CONVERSION USING DISTRIBUTION OF DIFFERENTIAL WAVEFORMS TO INTERLEAVED CONVERTERS

[75] Inventor: Masayuki Kawabata, Saitama-gun, Japan

[73] Assignee: Advantest Corp., Tokyo, Japan

[21] Appl. No.: 196,071

[22] PCT Filed: Jun. 15, 1993

[86] PCT No.: PCT/JP93/00800

§ 371 Date: Jun. 7, 1994

§ 102(e) Date: Jun. 7, 1994

[87] PCT Pub. No.: WO93/26093

PCT Pub. Date: Dec. 23, 1993

[30] Foreign Application Priority Data

Jun. 17, 1992 [JP] Japan ................. 4-158051
Jun. 17, 1992 [JP] Japan ................. 4-158052

[51] Int. Cl.$^6$ ................................................ H03M 1/00
[52] U.S. Cl. .................. 341/141; 341/144; 341/155
[58] Field of Search .................... 341/141, 144, 341/155

[56] References Cited

U.S. PATENT DOCUMENTS

| | | | |
|---|---|---|---|
| 4,353,057 | 10/1982 | Bernet et al. | 341/141 |
| 4,591,832 | 5/1986 | Fling et al. | 341/141 |
| 4,968,988 | 11/1990 | Miki et al. | 341/141 |
| 5,268,688 | 12/1993 | Meyers et al. | 341/144 |
| 5,355,134 | 10/1994 | Kasuga et al. | 341/144 |

FOREIGN PATENT DOCUMENTS

| | | |
|---|---|---|
| 51-83714 | 7/1976 | Japan . |
| 57-140026 | 8/1982 | Japan . |
| 62-135243 | 8/1987 | Japan . |
| 62-287717 | 12/1987 | Japan . |
| 1-314417 | 12/1989 | Japan . |

*Primary Examiner*—Howard L. Williams
*Attorney, Agent, or Firm*—Staas & Halsey

[57] ABSTRACT

To implement a high-speed, high-resolution A/D (or D/A) converter, a differential waveform of an analog (or digital) waveform signal is generated by a differential waveform generating part 10, the differential waveform is distributed to N integrators $14_1$ through $14_N$ in a repeating cyclic order at the timing of a clock $CK_0$, N being an integer equal to or greater than 2, and the integrator outputs are converted by converting parts $15_1$ through $15_N$ to digital (or analog) signals. These converted outputs are added together by an adder 16, whose output is provided as a digital (or analog) waveform signal.

10 Claims, 18 Drawing Sheets

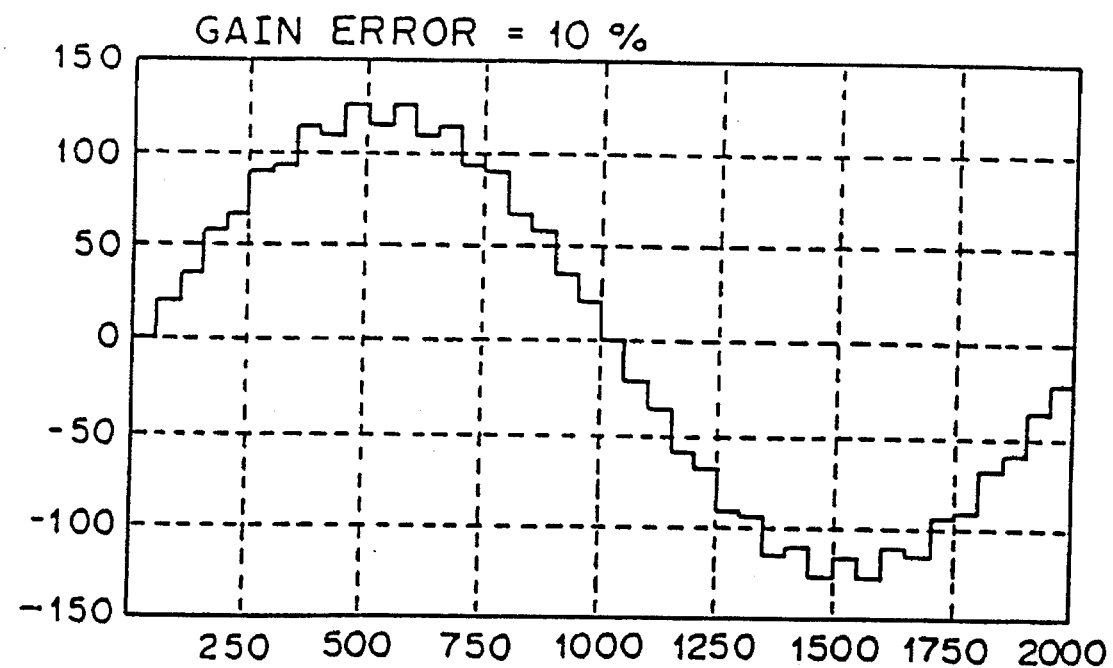
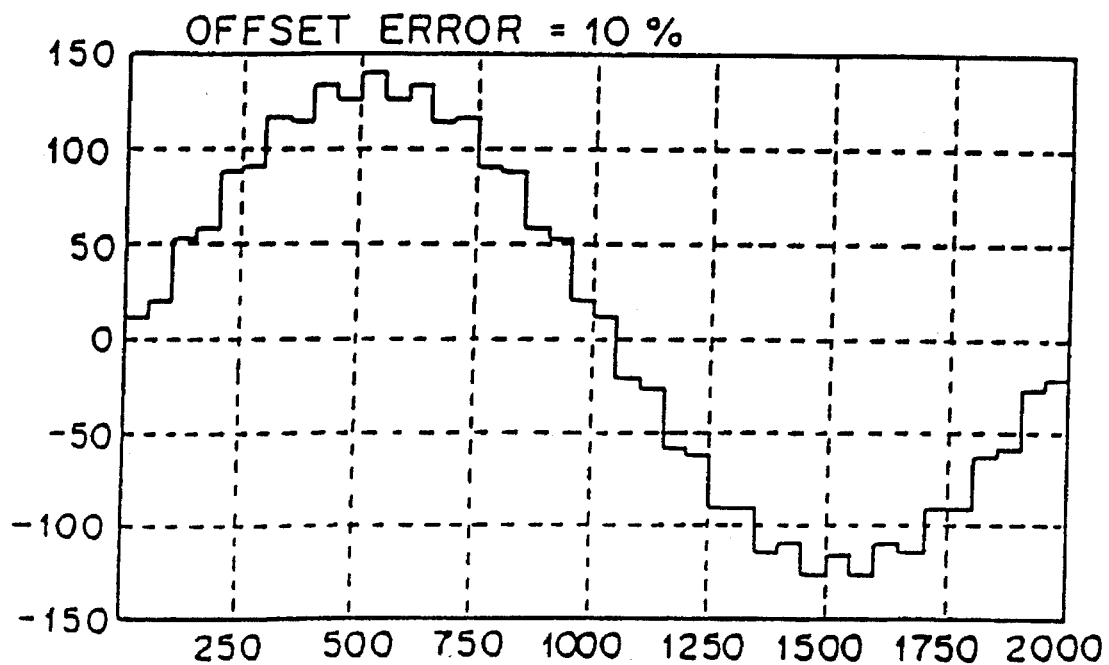

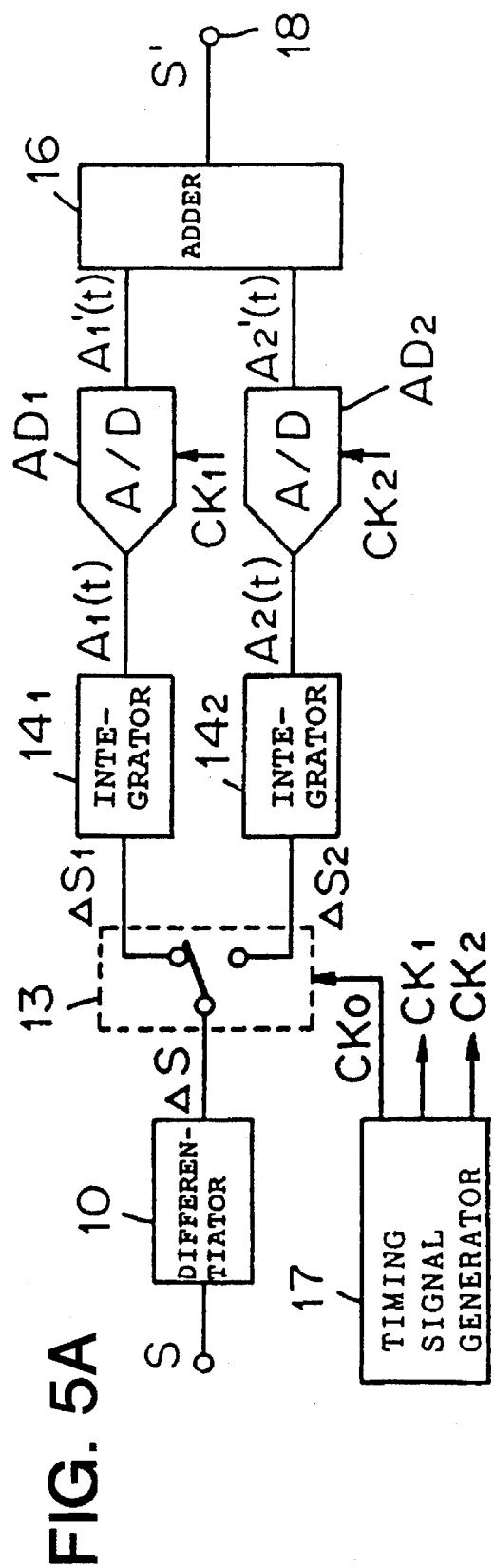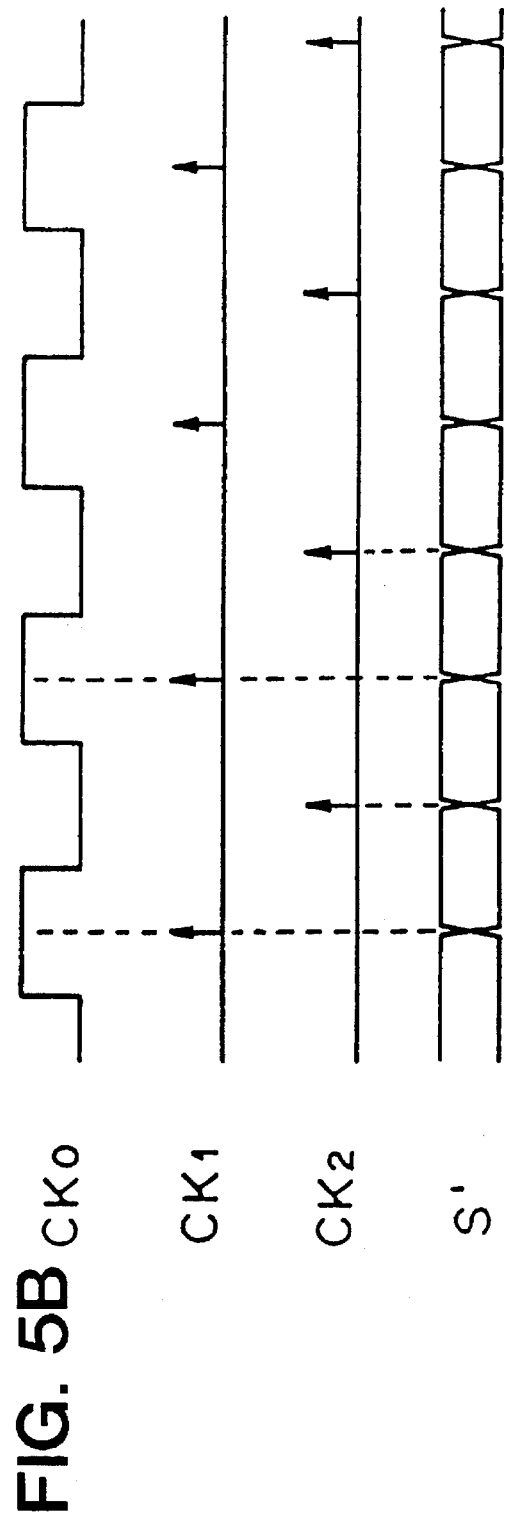

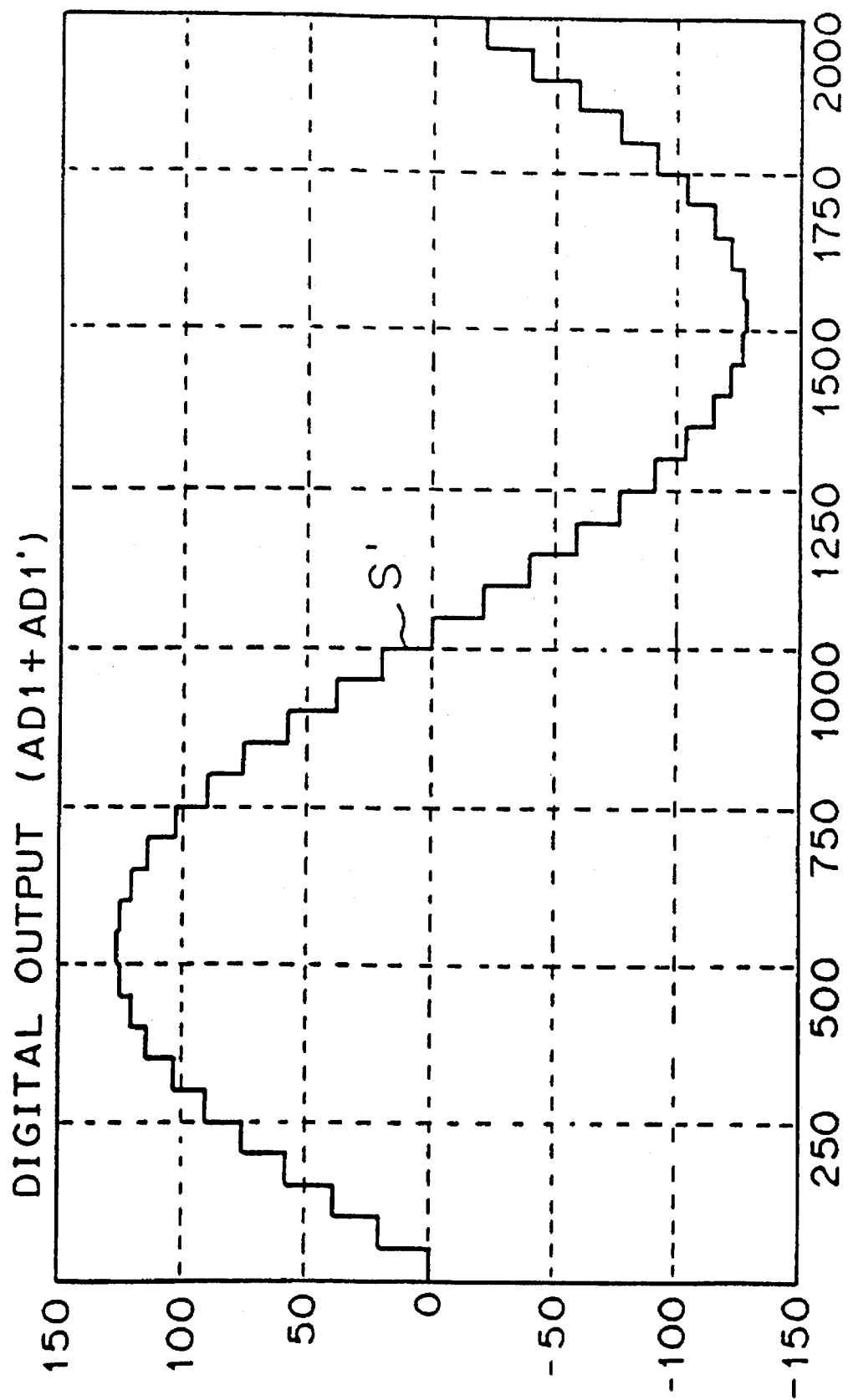

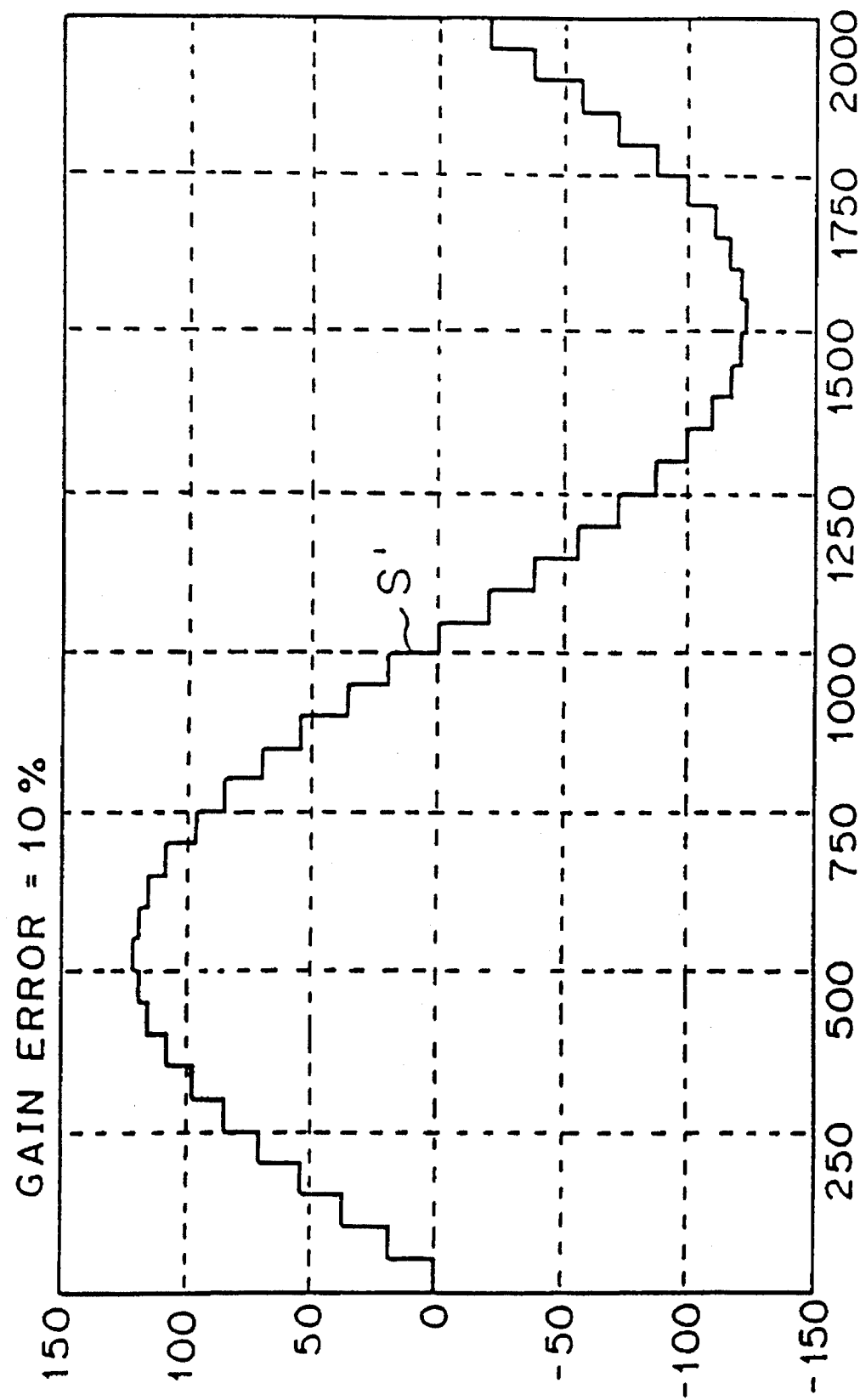

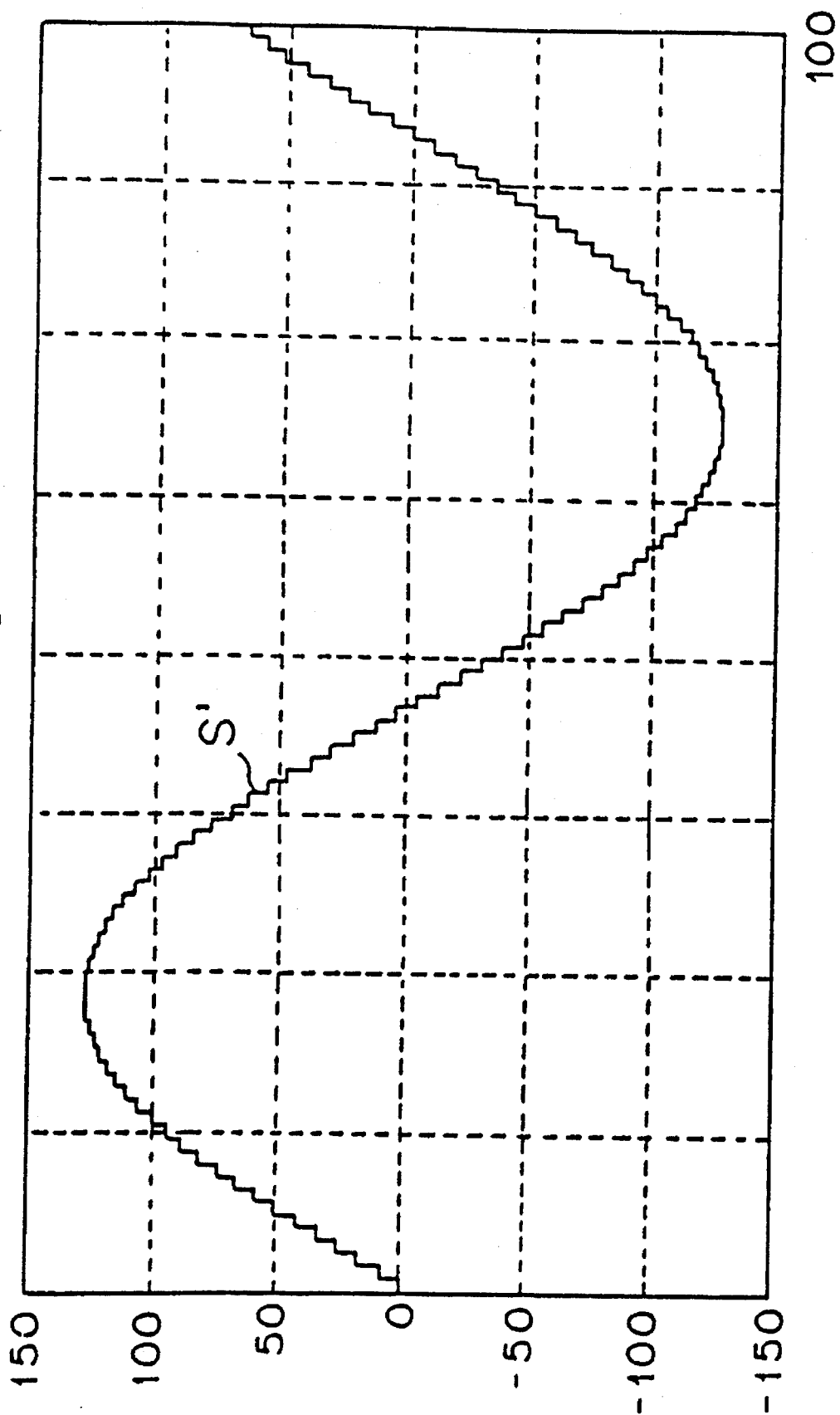

A/D OR D/A CONVERSION USING DISTRIBUTION OF DIFFERENTIAL WAVEFORMS TO INTERLEAVED CONVERTERS

TECHNICAL FIELD

The present invention relates to an A/D converter and a D/A converter for converting an analog or digital waveform signal to digital or analog waveform signal and, more particularly, to an A/D converter and a D/A converter which implement high-speed, high-resolution waveform conversion through use of a plurality of A/D or D/A conversion parts.

In general, high resolution and high-speed operations are required to convert an analog or digital waveform to a digital or analog signal with high precision. However, high-speed, high-resolution A/D and D/A converters are very expensive. Hence, it is customary in the prior art to implement a converter whose conversion rate, as a whole, is made N-fold by applying waveform signals to a plurality (N) of low-speed, high-resolution converting parts, converting the signals one after another at a fixed time interval while shifting their phases by a time T/N, and outputting the converted versions one after another from the converting parts in a circulating fashion. A description will be given, with reference to FIGS. 1A and 1B, of the case of implementing an A/D converter, for instance.

FIG. 1A is a block diagram of the A/D converter of the above-mentioned prior art example, in which plural, for example, two A/D converting parts $AD_1$ and $AD_2$ are connected in parallel to and are driven alternately with each other to thereby implement an A/D converter of an operating speed twice higher than that of a single A/D converting part. The A/D converting parts $AD_1$ and $AD_2$ have their inputs connected in parallel to each other and alternately convert the amplitude of the input analog waveforms $S_A$ thereto to digital values $D_1$ and $D_2$ at the timing of their clocks $CK_1$ and $CK_2$ as shown in FIG. 1B and each hold the converted value until the occurrence of the next clock.

A multiplexer 2 responds to the clocks $CK_1$ and $CK_2$ to output the digital values $D_1$ and $D_2$ alternately with each other, providing a digital waveform $S_D$. As shown in FIG. 1B, the digital waveform $S_D$ is composed of outputs $a_n$ and $b_n$ that are provided alternately from the A/D converting parts $AD_1$ and $AD_2$; thus, the A/D converter outputs data at an operating speed twice higher than that of the individual A/D converting parts $AD_1$ and $AD_2$.

In the above-described A/D converter wherein a plurality of A/D converting parts are connected in parallel and are sequentially activated, for example, in the case of FIG. 1A, a gain error and an offset error that are inevitably exist between the A/D converting parts $AD_1$ and $AD_2$ will distort the waveform as depicted in FIGS. 2A and 2B. FIG. 2A is a diagram showing a digital data waveform distorted by the gain error; the gain error between the both A/D converting parts is 10% in this example. FIG. 2B is a diagram showing a digital data waveform distorted by the offset error; the offset error between the both converting parts is 10% in this example. In either of FIGS. 2A and 2B, the error appears intact between adjacent pieces of data in the output of the multiplexer 2. Furthermore, since the output from the multiplexer 2 only switches between the outputs from the A/D converting parts $AD_1$ and $AD_2$ alternately, the resolution of the output value is the same as that of the individual A/D converting parts $AD_1$ and $AD_2$. That is, the construction of FIG. 1A permits the speeding up of the A/D converting operation but fails to improve the resolution of the converted output $S_D$. In FIG. 1A, by providing an adder in place of the multiplexer 2 and outputting therefrom the sums of adjacent pieces of data, $a_1+b_1$, $b_1+a_2$, $a_2+b_3$, $b_3+a_4$, ..., the distortion by the error between the A/D converting parts $AD_1$ and $AD_2$ is averaged and hence is improved, but the resolution is not improved.

The D/A converter for waveform conversion also encounters similar problems. That is, by distributing an input digital waveform signal to a plurality of D/A converting parts one after another through a multiplexer for conversion into analog signals and then switching the converted outputs one after another through a switch to output an analog waveform signal, the operating speed for the D/A conversion can be increased, but the output waveform is distorted by a gain error and an offset error between the plurality of D/A converting parts and the resolution of the output analog waveform is not improved. Also in this instance, if the output changeover switch is replaced with an analog adder, the gain and offset errors between the respective D/A converting parts are averaged, and consequently, the distortion by these errors is reduced but the resolution still remains unimproved. That is, as is the case with FIG. 1A, to add the outputs from a plurality of converting parts in the A/D or D/A converting device is to average the amplitude of a waveform at a plurality of successive sample points—this only makes the waveform gentle by applying the waveform signal to a low-pass filter and does not improve resolution.

An object of the present invention is to provide an A/D converter (or D/A converter) for waveform conversion which permits high-speed, high-resolution waveform conversion through use of a plurality of A/D (or D/A) converting parts and reduces the distortion of the converted output waveform that is attributable to the gain and offset errors between the converting parts.

DISCLOSURE OF THE INVENTION

The A/D (or D/A) converter for waveform conversion according to the present invention is constructed by: differential waveform generating means for generating a differential waveform of a waveform signal; distributing means for distributing the differential waveform to N converting means in a repeating cyclic order, N being an integer equal to or greater than 2; N converting means each composed of a cascade connection of integrating means and A/D (or D/A) converting means, for outputting a digital integrated waveform (or analog integrated waveform) of the distributed differential waveform; and adding means for adding together the outputs from the N converting means to output a digital converted waveform (or analog converted waveform).

With the construction mentioned above, each converting means needs only to convert every N-th one of differential waveforms that are distributed from the distributing means—this permits high-speed conversion throughout the N converting means. In addition, according to the present invention, the output from the adding means represents the amplitude itself at each sample point of the input waveform, i.e. the waveform before conversion, not the average value of the waveform. Hence, resolution at the output of the adding means is increased N times higher than the resolution of the individual converting means. Besides, since the outputs from the N converting means are added together, the gain and offset errors between the converting means are averaged down to 1/N.

BRIEF DESCRIPTION OF THE DRAWINGS

FIG. 2A is a diagram showing an output digital waveform from the A/D converter of FIG. 1A which contains distortion attributable to a 10% gain error.

FIG. 2B is a diagram showing an output digital waveform from the A/D converter of FIG. 1A which contains distortion attributable to a 10% offset error.

FIG. 5A is a block diagram illustrating an embodiment of the A/D converter according to the present invention.

FIG. 5B is a timing chart showing the operation of the A/D converter depicted in FIG. 5A.

FIG. 11 is a diagram showing the output digital waveform from the adder in the case where no error is present between the A/D converting parts $AD_1$ and $AD_2$.

FIG. 12 is a diagram showing the output digital waveform from the adder in the case where a 10% gain error is present between the converting parts $AD_1$ and $AD_2$.

FIG. 16 is a diagram showing an example of the D/A converted output waveform of the FIG. 14 embodiment.

BEST MODE FOR CARRYING OUT THE INVENTION

Figure 3:
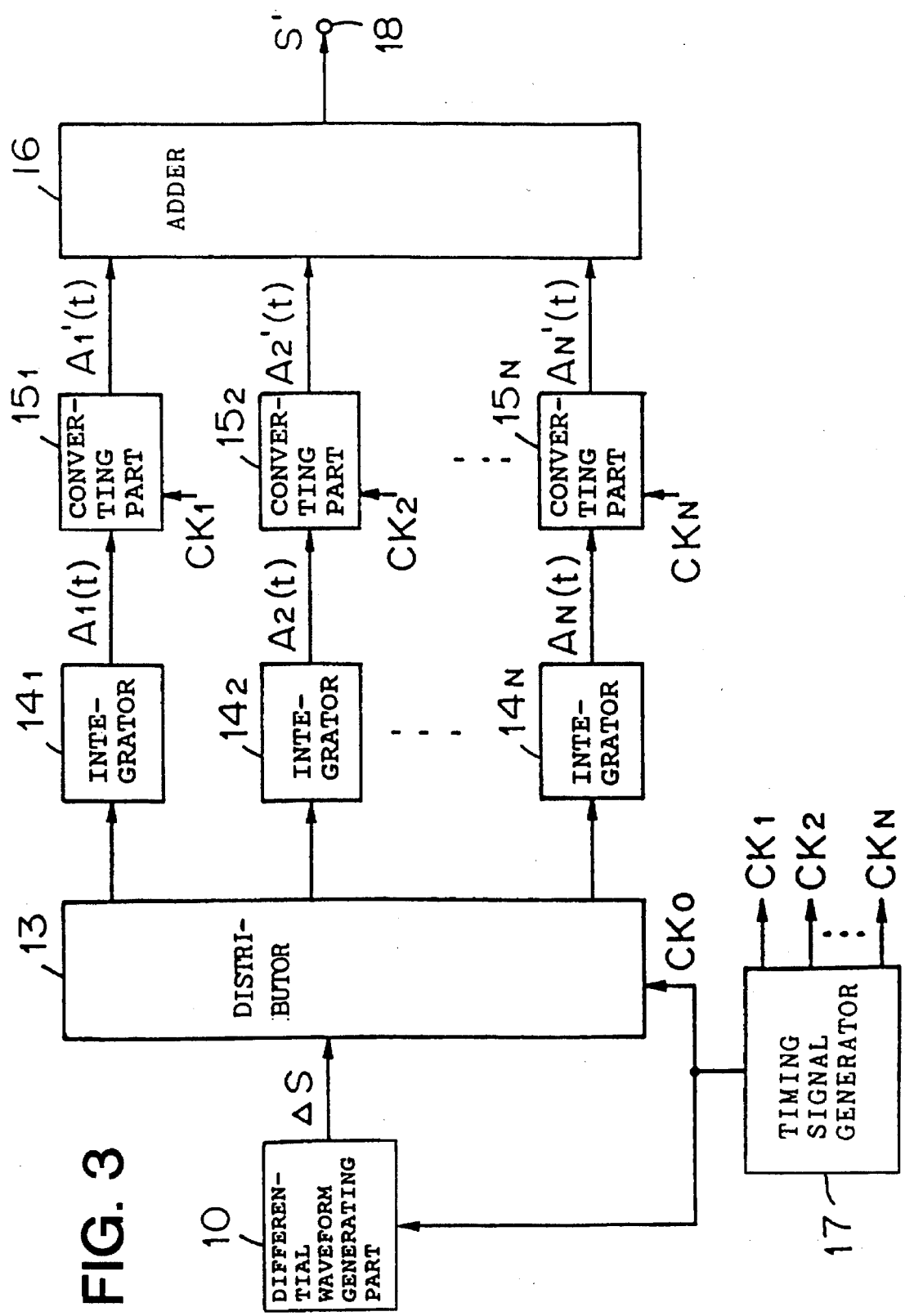
FIG. 3 is a block diagram illustrating the basic construction of the A/D converter and the D/A converter for waveform conversion according to the present invention.

FIG. 3 is a theoretical block diagram showing either of the A/D converter and the D/A converter according to the present invention. That is, in the case where a differential waveform $\Delta S$ that is output from a differential waveform generating part 10 is an analog signal, converting parts $15_1$ through $15_N$ are all A/D converting parts, and when the differential waveform $\Delta S$ is a digital signal, the converting parts $15_1$ through $15_N$ are D/A converting parts. In the present invention the differential value $\Delta S$ of the waveform is fed from the differential waveform generating part 10 to a distributor 13. The distributor 13 repeats distributing the differential value $\Delta S$ to the N (where N is an integer equal to or greater than 2) integrators $14_1$ through $14_N$ one after another in synchronization with a clock signal $CK_0$ from a timing signal generator 17. The integrators $14_1$ through $14_N$ integrate the differential values distributed thereto and the integrated outputs are A/D or D/A converted by the converting parts $15_1$ through $15_N$ at the timing of clock signals $CK_1$ through $CK_N$. Converted outputs $A_1'(t)$ through $A_N'(t)$ from the converting parts $15_1$ through $15_N$ are provided to and added together by an adder 16, and a converted output waveform S' is obtained at a terminal 18. t represents, by integers 0, 1, 2, . . . , discrete points in time every period $\Delta t$ of the clock signal $CK_0$ that is fed to the distributor 13. Letting the distribution period in the distributor 13 be represented by T, then $T = \Delta t N$.

Figure 4:
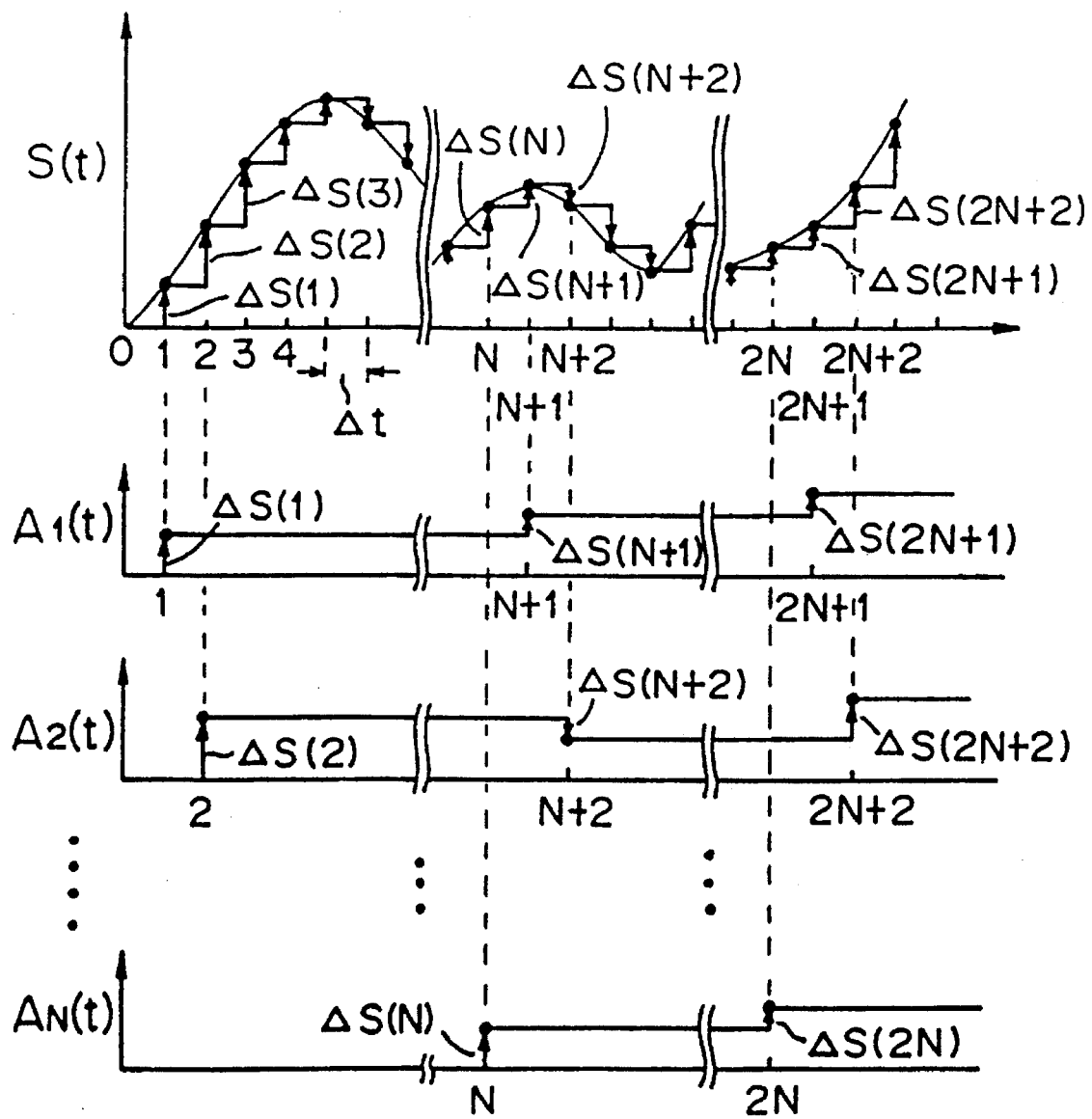
FIG. 4 is a waveform diagram for explaining the operation of the converters depicted in FIG. 3.

FIG. 4 shows waveforms that occur at respective parts of the A/D or D/A converter, for explaining the principle of operation thereof. A description will be given of the case of an A/D converter, for instance. An analog waveform signal S is applied to the differential waveform generating part 10, from which variations $\Delta S(1), \Delta S(2), \Delta S(3), \ldots$ of the input waveform signal every clock $CK_0$ are sequentially output as the differential waveform $\Delta S$. The distributor 13 distributes these variations to the integrators $14_1$ through $14_N$ in a sequential order. For example, the integrator 14 is supplied with the variations $\Delta S(1), \Delta S(N+1), \Delta S(2N+1), \ldots$ at time intervals $\Delta t N$ and integrates them. The resulting integrated output $A_1(t)$ varies stepwise as shown. The integrated output $A_1(t)$ is A/D converted by the A/D converting part $15_1$ and the converted output $A_1'(t)$ is fed to the adder 16. Similar processing is also carried out by corresponding combinations of the integrators $14_2$ through $14_N$ and converting parts $15_2$ through $15_N$, and the adder 16 adds together the converted signals $A_1'(t)$ through $A_N'(t)$ and provides the added output as the converted digital signal S'.

As is evident from FIG. 4, the respective added outputs $S'(1), S'(2), \ldots$ at $t = 1, 2, 3, \ldots$ form the digital waveform output S' corresponding to the analog input waveform signal S. For example, the output $S(N)$ from the adder 16 at the point $t = N$ is given as follows:

$$\begin{aligned} S(N) &= A_1'(N) + A_2'(N) + A_3'(N) + \ldots + A_N'(N) \\ &= A_1'(1) + A_2'(2) + A_3'(3) + \ldots + A_N'(N) \end{aligned}$$

Figure 1A:
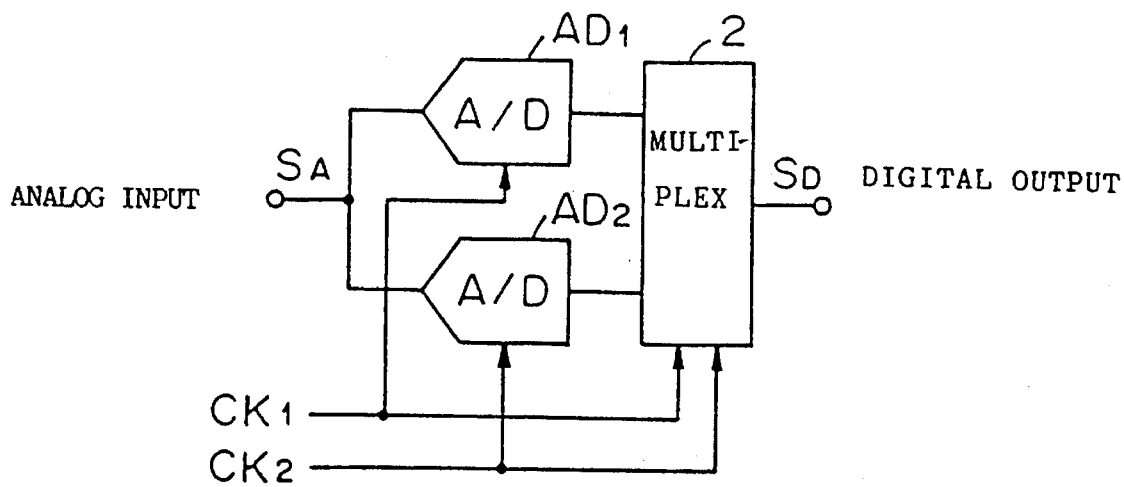
FIG. 1A is a block diagram showing an example of a conventional A/D converter adapted for high-speed operation through use of a plurality of A/D converting parts.
Figure 1B:
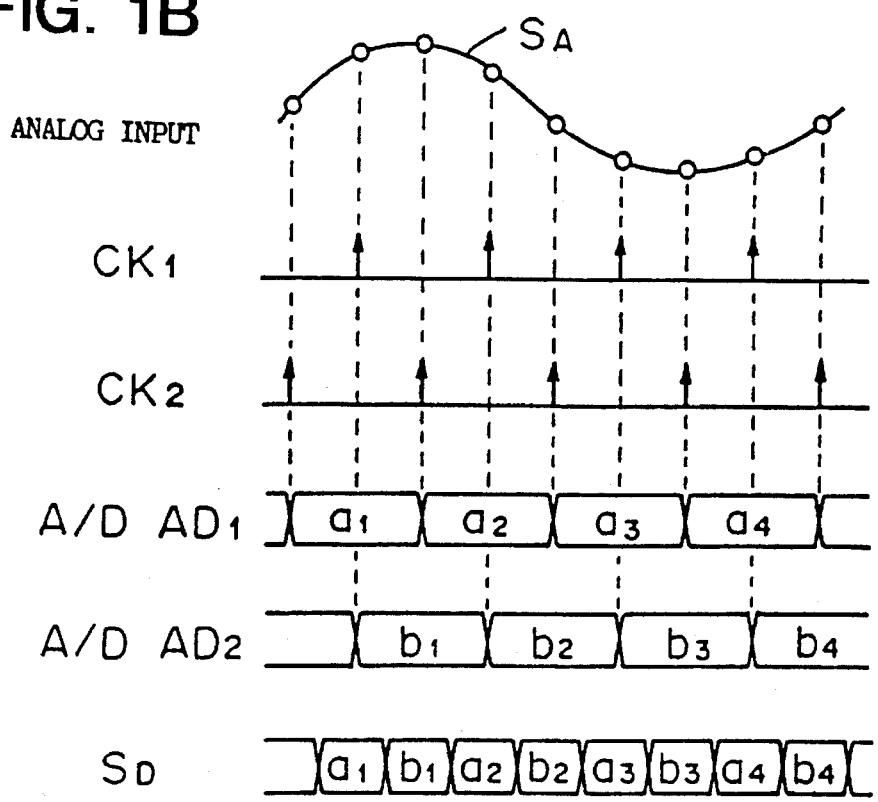
FIG. 1B is a timing chart for explaining the operation of the A/D converter shown in FIG. 1A.

Letting the minimum unit for conversion and the maximum value convertible by the respective converting parts $15_1$ through $15_N$ be represented by Q and Vmax, respectively, the maximum output value of the adder 16 is N.Vmax and its ratio to the minimum conversion unit Q is Q/(N.Vmax). That is, resolution is increased up to N times higher than that of a single converting part. On the other hand, when an adder is used in place of the multiplexer 2 in FIG. 1A, a mere addition of the outputs from the N (N =2 in FIG. 1A) converting parts $AD_1$ and $AD_2$ is to calculate S(1)+S(2)+ S(3)+...+S(N) in the waveform S(t) depicted in FIG. 4; this means averaging the waveform S(t) over the period t=1 through N and entirely differs in meaning from the addition by the adder 16 in the present invention shown in FIG. 3.

FIG. 5A is a block diagram of the converter of the present invention applied to an A/D converter, which employs two A/D converting parts $AD_1$ and $AD_2$. FIG. 5B is a timing chart for explaining the operation of the A/D converter shown in FIG. 5A.

The differential waveform generating part 10 is formed by a differentiator which differentiates the analog input waveform S to obtain its variations. The distributor 13 is a high-speed electronic switch, which responds to the clock $CK_0$ to output the differential output waveform ΔS to the integrators $14_1$ and $14_2$ alternately with each other. The integrators $14_1$ and $14_2$ integrate the differential output waveforms $ΔS_1$ and $ΔS_2$ that are distributed from the distributor 13. The A/D converting parts $AD_1$ and $AD_2$ converts the integrated outputs from the integrators $14_1$ and $14_2$ to digital values, respectively. The adder 16 adds together the output digital values from the A/D converting parts $AD_1$ and $AD_2$ and outputs the digital waveform S'.

Figure 6A:
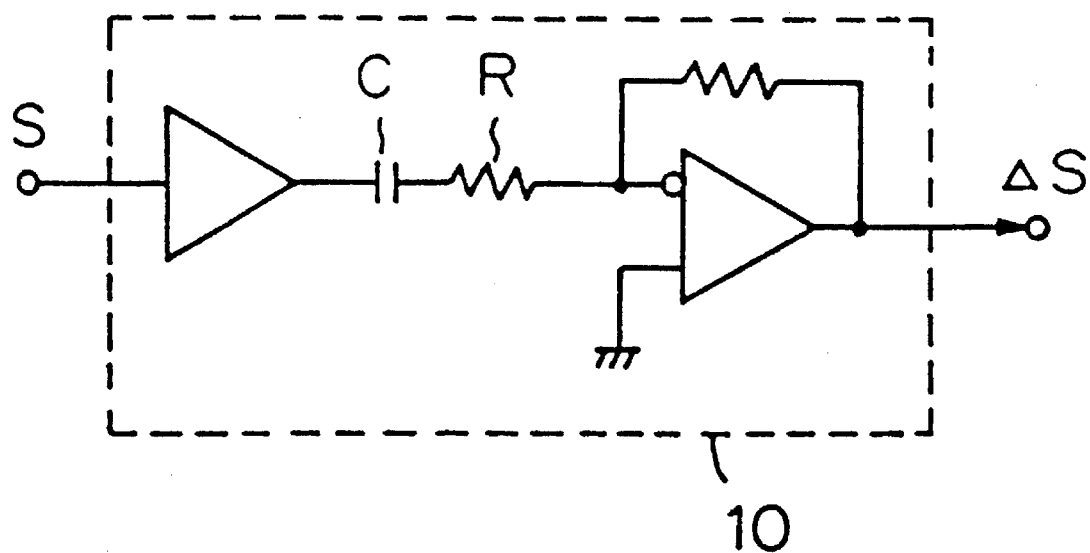
FIG. 6A is a diagram illustrating an embodiment of an analog differentiation circuit 10.
Figure 6B:
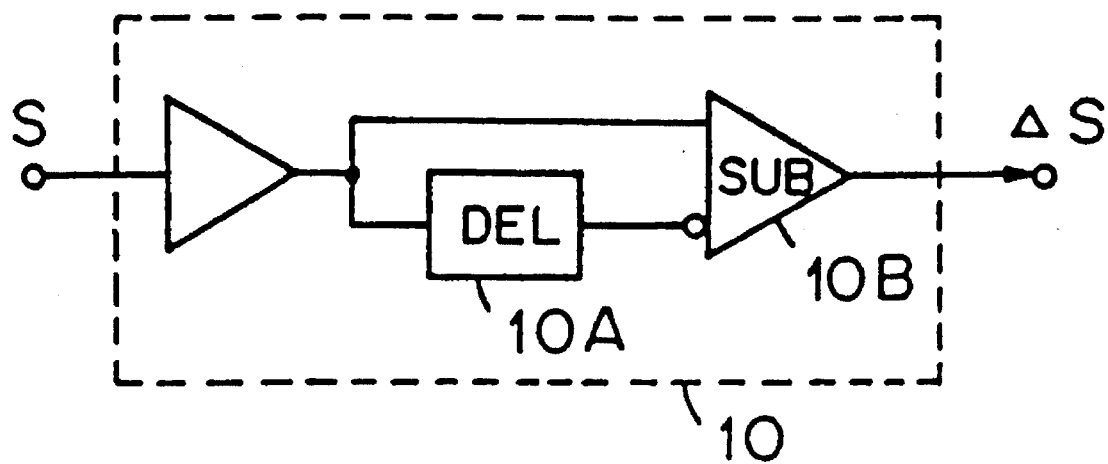
FIG. 6B is a diagram illustrating another embodiment of the analog differentiation circuit 10.

In FIG. 5A, the differentiation circuit 10 may be formed by a known primary high-pass filter using a capacitor C and a resistor R, for example, as shown in FIG. 6A. It is also possible to employ such a circuit construction as shown in FIG. 6B, in which the input analog waveform signal S is applied to the one input of a subtractor 10B and a waveform signal S delayed by a delay element 10B for a predetermined period of time is applied to the other input of the subtractor and the difference between these two signals is obtained as the differential output ΔS. It will easily be understood by those skilled in the art that various other differentiation circuits can be used.

Figure 7A:
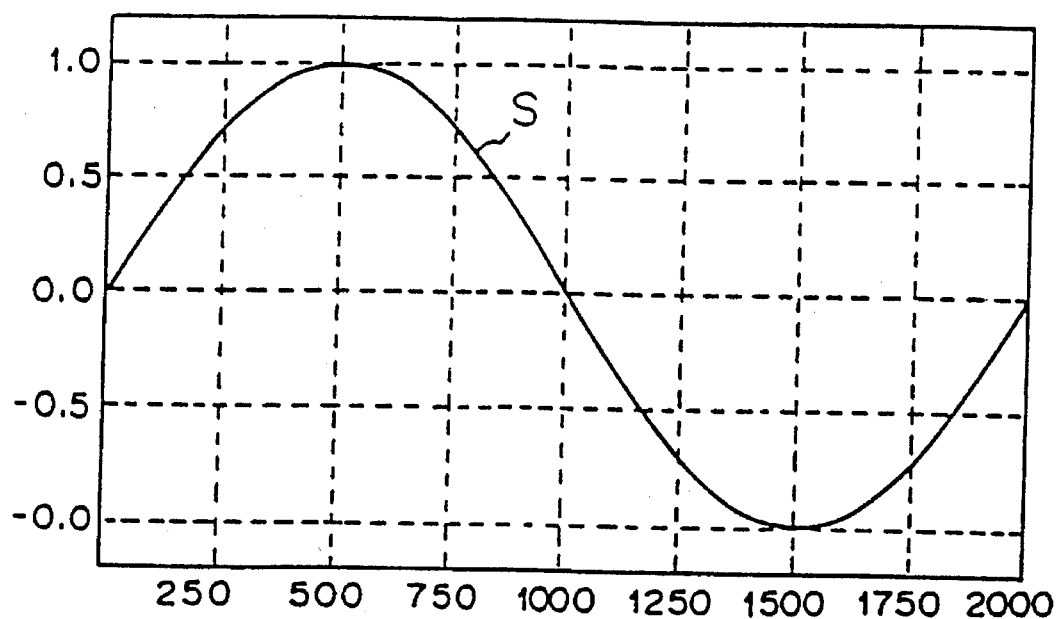
FIG. 7A is a diagram showing an analog input waveform to the differentiation circuit 10.
Figure 7B:
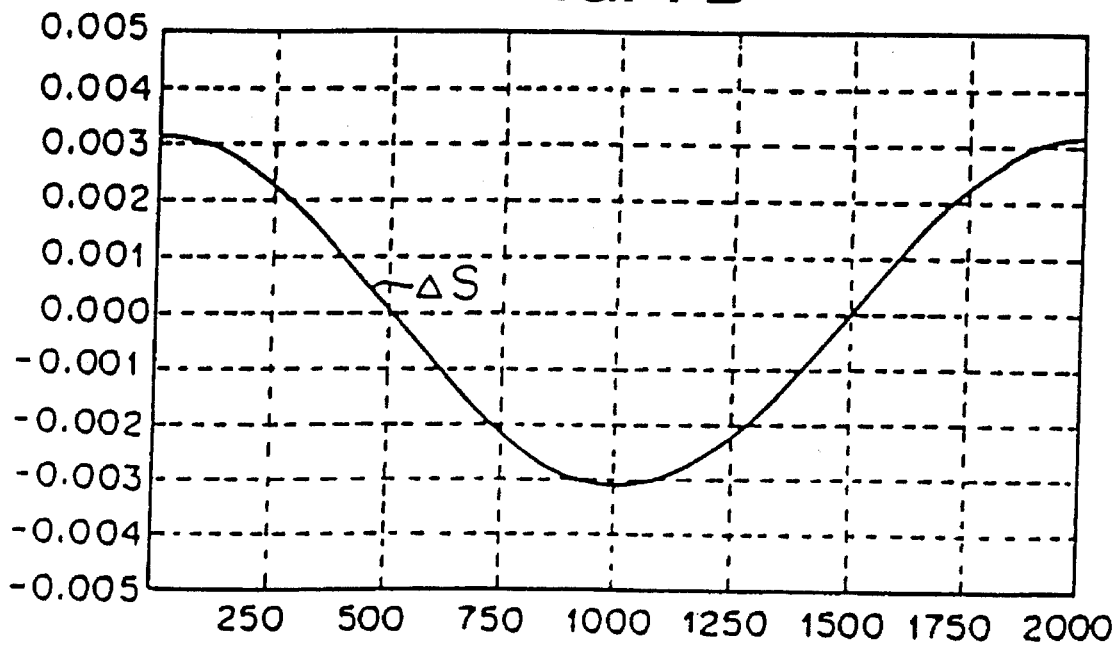
FIG. 7B is a diagram showing the output waveform from the differentiation circuit 10 which has differentiated the analog input waveform.
Figure 8A:
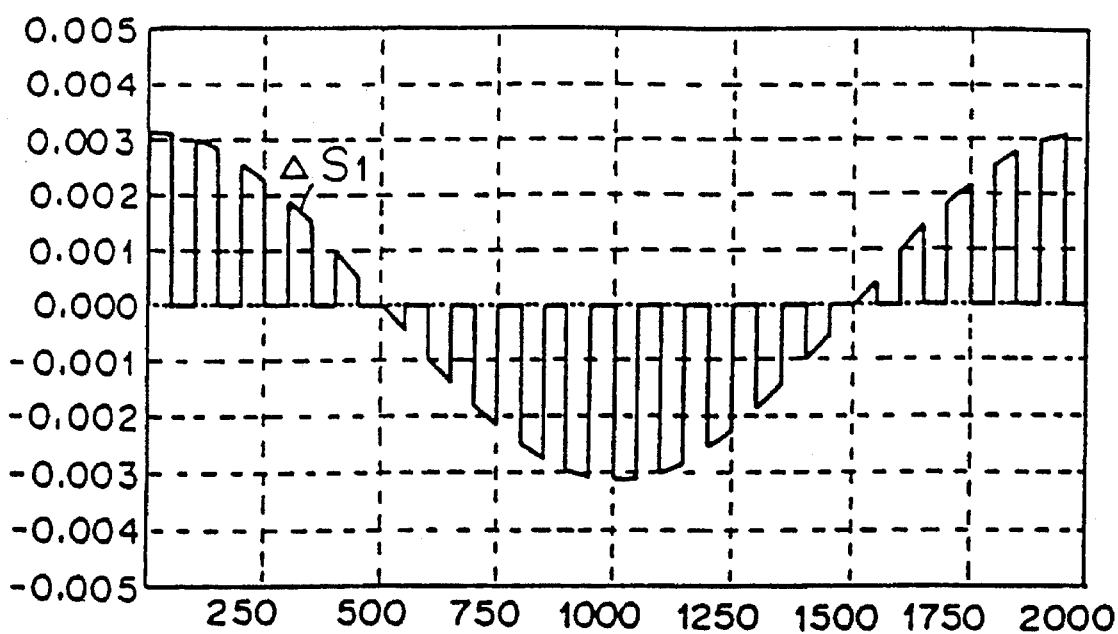
FIG. 8A is a diagram showing one of two output waveforms distributed by a distributor 13.
Figure 8B:
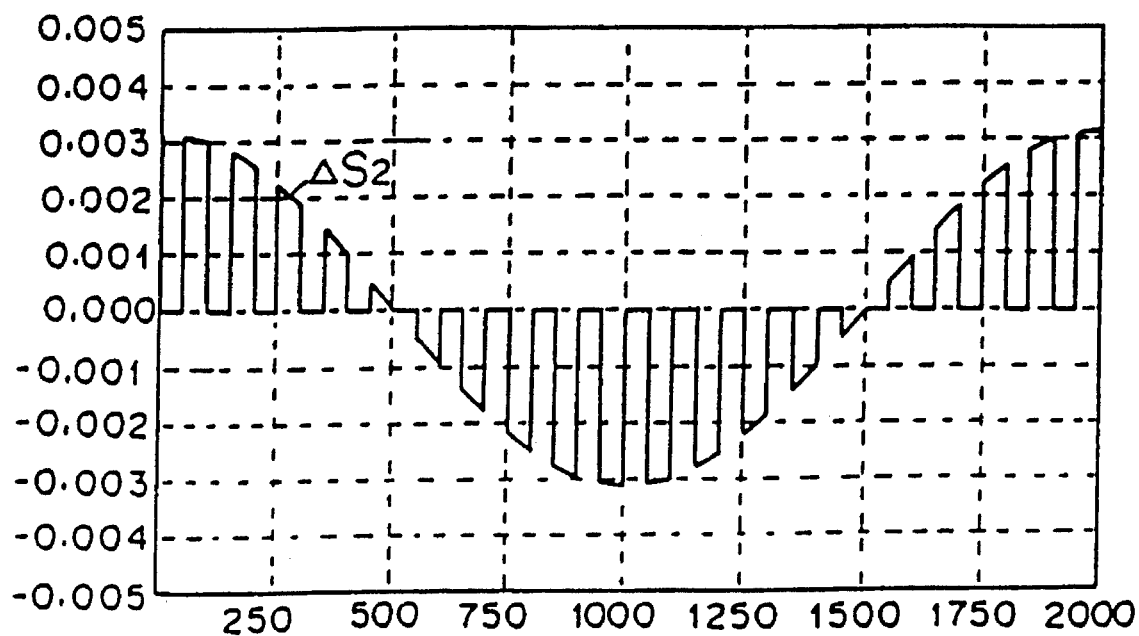
FIG. 8B is a diagram showing the other output waveform distributed by the distributor 13.

For instance, when a sinusoidal signal shown in FIG. 7A is fed as the analog input waveform S to the differentiation circuit 10 in FIG. 5A, the output ΔS from the differentiation circuit 10 becomes such a cosine-wave signal as shown in FIG. 7B. Distributing the cosine-wave signal ΔS by the distributor 13 into two series, signals $ΔS_1$ and $ΔS_2$ depicted in FIGS. 8A and 8B are obtained. Incidentally, the distributor 13 is formed by a high-speed electronic switch, whose connection is changed over in accordance with the control clock $CK_0$ from the timing signal generating part 17, such as shown in FIG. 5B.

Figure 9A:
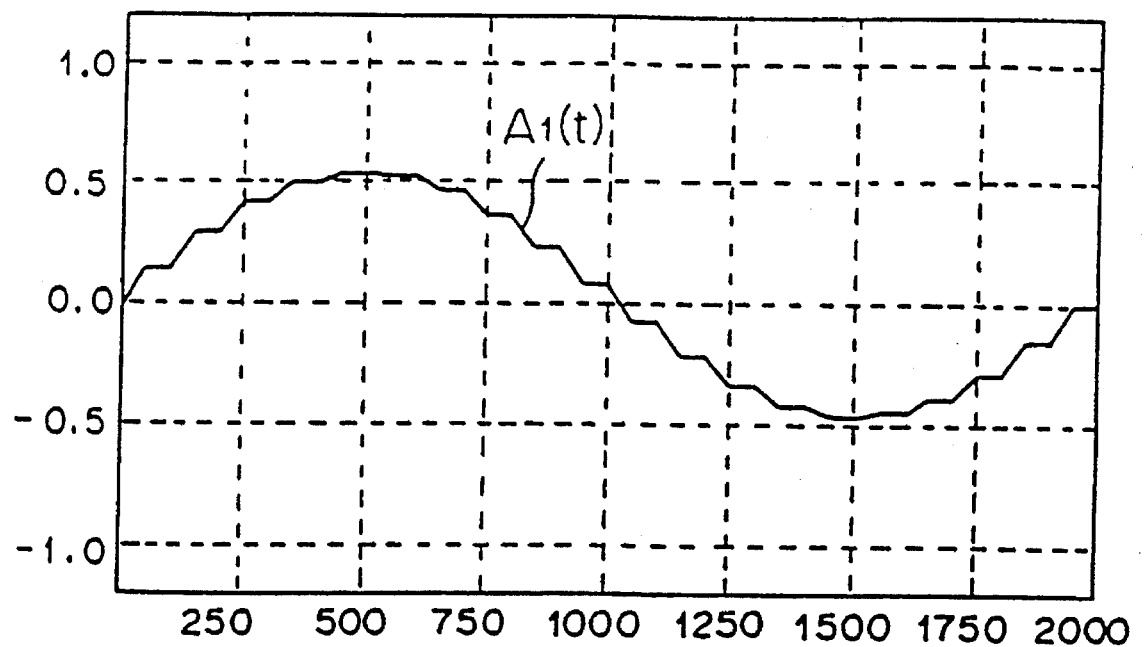
FIG. 9A is a diagram showing the output waveform from the one integrator $14_1$.

The distributed output waveform $ΔS_1$, shown in FIG. 8A, is fed to and integrated by the integrator $14_1$. FIG. 9A shows the output waveform $A_1(t)$ from the integrator $14_1$. That is, upon each occurrence of a substantially strip-like input, it is integrated by the integrator $14_1$ and its output waveform $A_1(t)$ increases or decreases. In respective section where no such strip-shaped input is present, the output waveform $A_1(t)$ from the integrator $14_1$ maintains the level immediately preceding the section. As is the case with the above, the distributed output waveform $ΔS_2$ shown in FIG. 8B is provided to and integrated by the integrator $14_2$, from which is obtained the integrated output waveform $A_2(t)$ depicted in FIG. 9B.

Figure 9B:
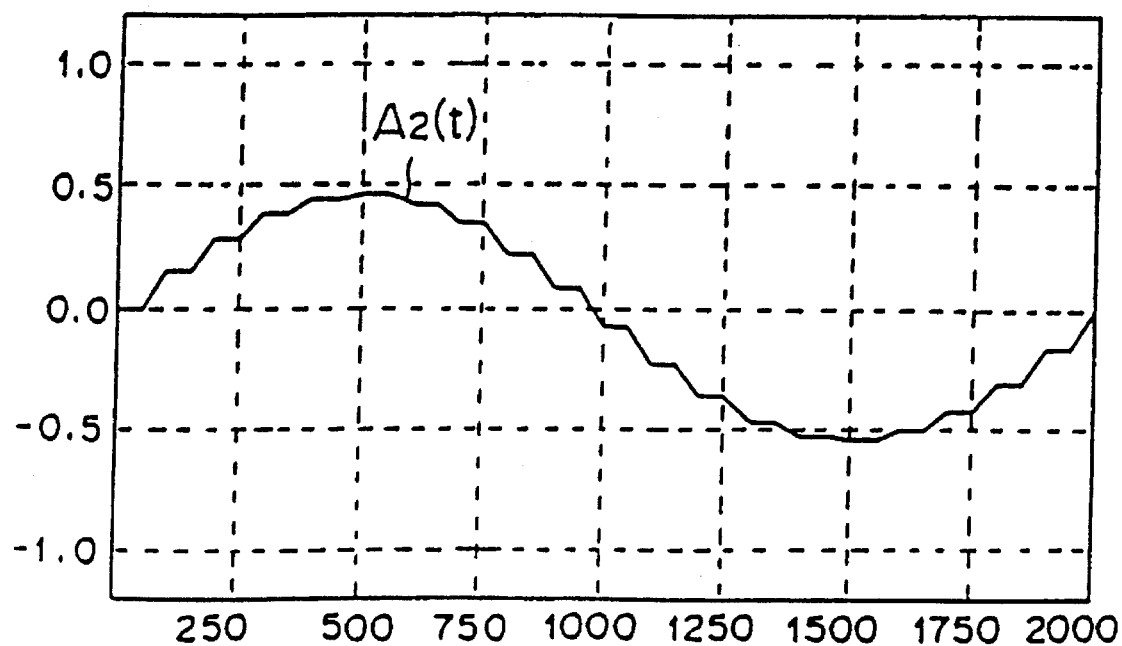
FIG. 9B is a diagram showing the output waveform from the other integrator $14_2$.
Figure 10A:
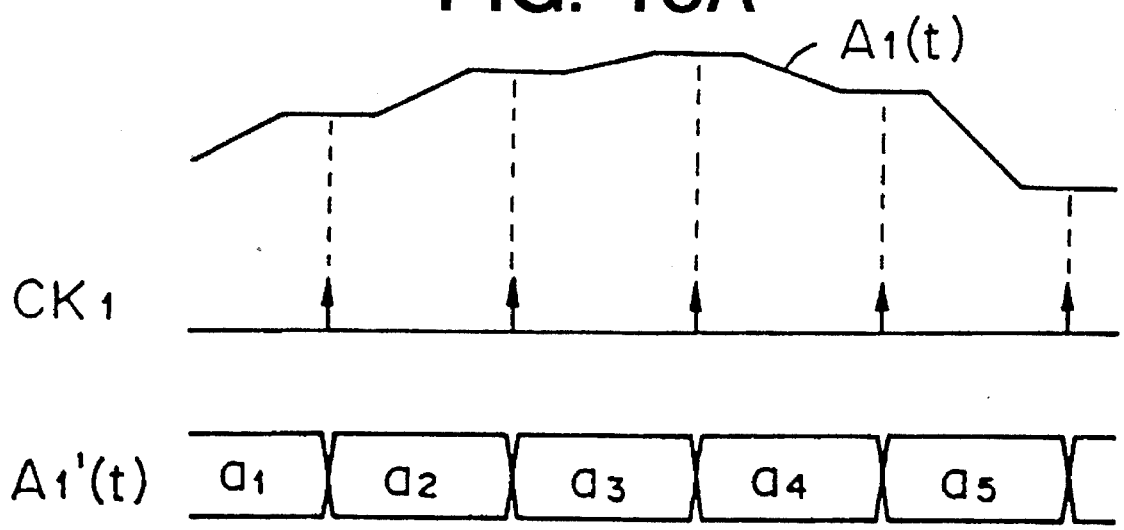
FIG. 10A is a diagram for explaining how to control the timing for A/D conversion in the one A/D converting part $AD_1$.
Figure 10B:
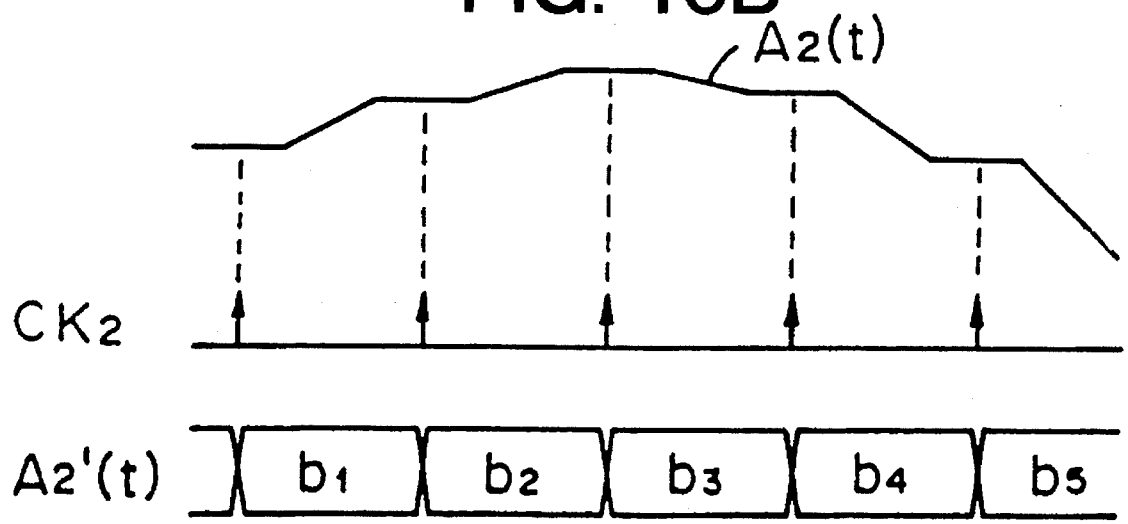
FIG. 10B is a diagram for explaining how to control the timing for A/D conversion in the other A/D converting part $AD_2$.

The output waveforms $A_1(t)$ and $A_2(t)$ shown in FIGS. 9A and 9B are fed to the A/D converting parts $AD_1$ and $AD_2$, respectively. As shown in FIGS. 10A and 10B, the A/D converting parts $AD_1$ and $AD_2$ convert the integrated outputs $A_1(t)$ and $A_2(t)$ into a sequence $A_1'(t)$ of digital values $a_1, a_2, a_3, \ldots$ and a sequence $A_2'(t)$ of digital values $b_1, b_2, b_3, \ldots$ at the timing of the clock signals $CK_1$ and $CK_2$ from the timing signal generating part 17, respectively. By timing the clock signals $CK_1$ and $CK_2$ to occur at substantially the middle of each section during which the levels of the integrated outputs $A_1(t)$ and $A_2(t)$ are held constant, it is possible to provide leeway for the timing accuracy in that section.

Figure 10C:
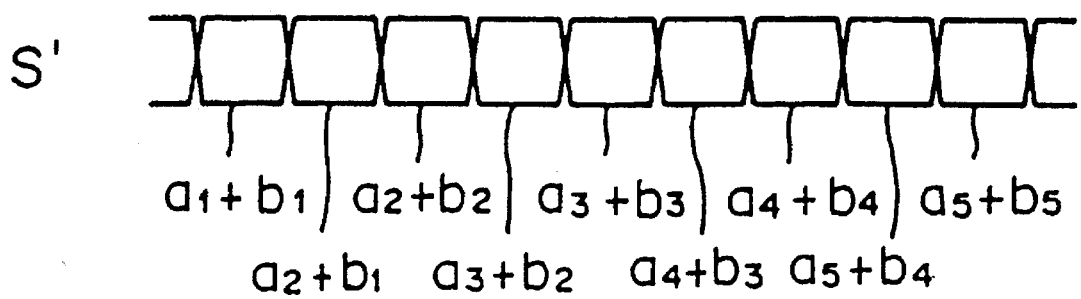
FIG. 10C is a diagram showing the output digital waveform data from an adder 16.

FIG. 10C shows a data sequence of the digital waveform S' obtained by adding together the digital outputs $A_1'(t)$ and $A_2'(t)$ from the A/D converting parts $AD_1$ and $AD_2$ in the adder 16, and the added digital waveform is such as shown in FIG. 11, for instance. Incidentally, this is the case where no gain and offset errors exist between the A/D converting parts $AD_1$ and $AD_2$.

FIG. 12 shows an example of the output digital waveform S' provided from the adder 16 when a 10% gain error exists between the two A/D converting parts $AD_1$ and $AD_2$; in this case, the waveform contains a total of about 5% gain error but its distortion is small.

Figure 13:
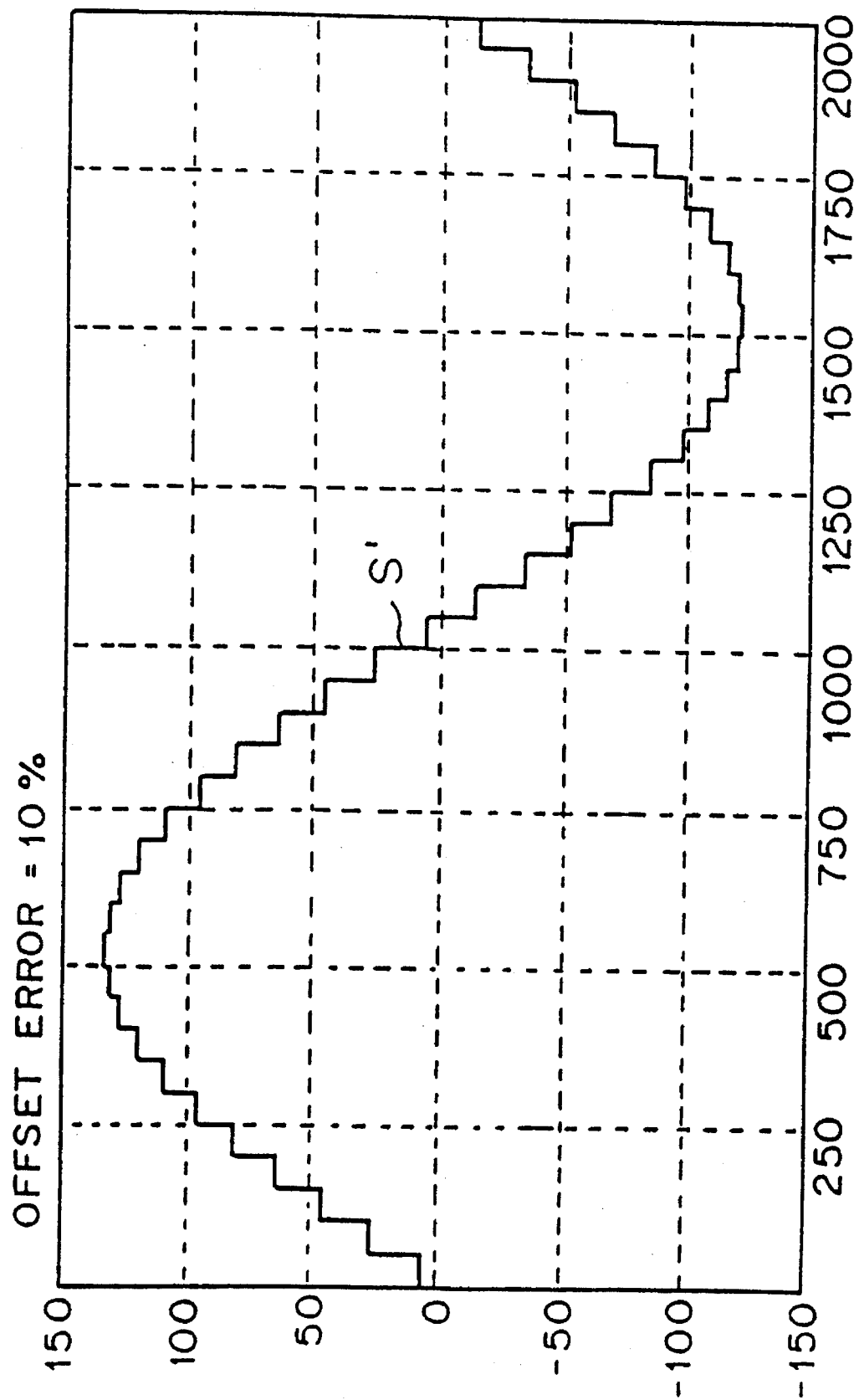
FIG. 13 is a diagram showing the output digital waveform from the adder in the case where a 10% offset error is present between the converting parts $AD_1$ and $AD_2$.

FIG. 13 shows an example of the output digital waveform from the adder in the case where a 10% offset error exists between the two A/D converting parts $AD_1$ and $AD_2$; in this instance, the waveform contains a total of about 5% offset error but its distortion is small.

Figure 14:
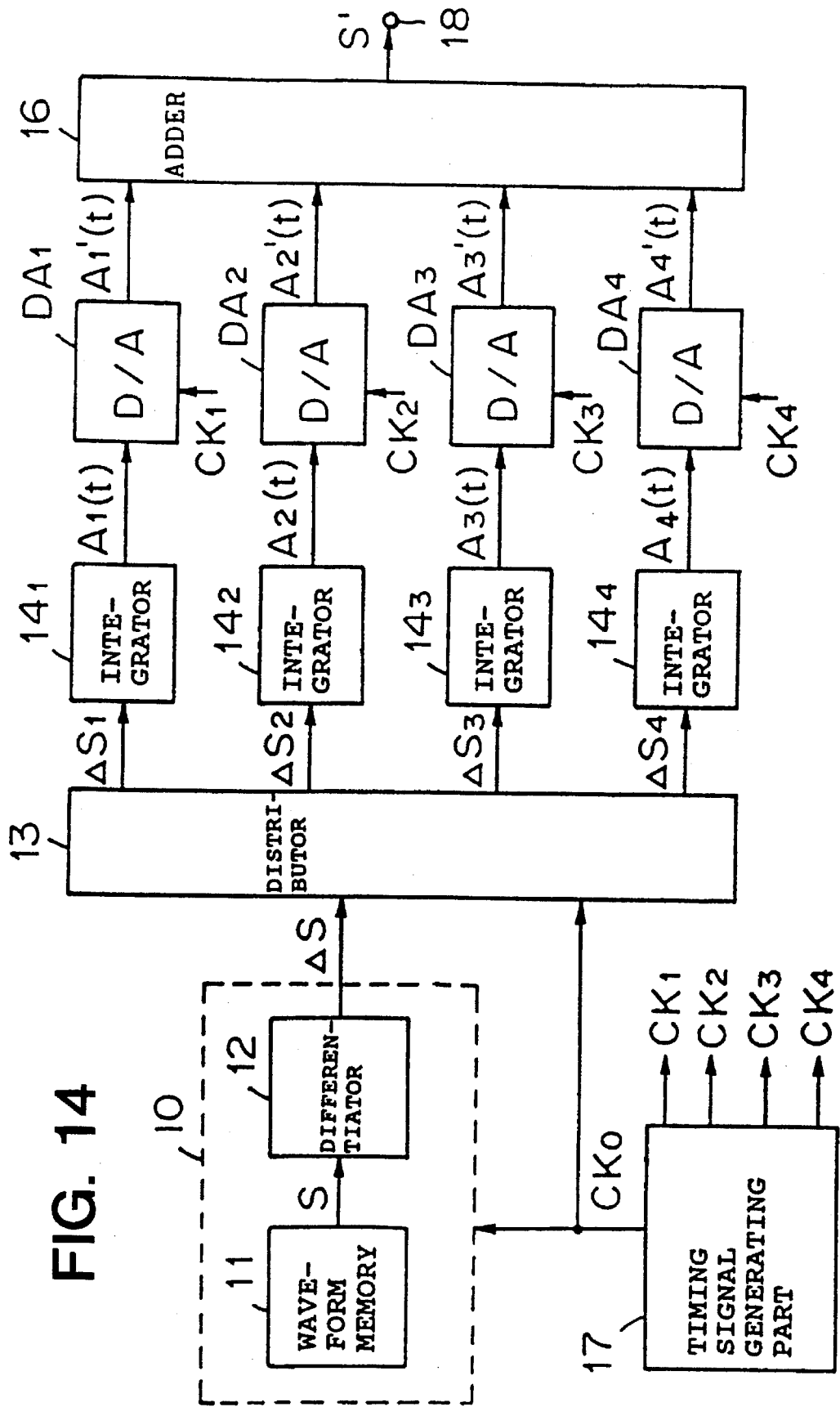
FIG. 14 is a block diagram illustrating an embodiment of the present invention of FIG. 3 applied to a D/A converter.

FIG. 14 illustrates an embodiment of the FIG. 3 construction of the invention applied to a D/A converter for waveform conversion, in which the number of distributed outputs, N, by the distributor 13 is 4. The input digital waveform signal S may be provided from the outside, but in this embodiment, the differential waveform generating part 10 is formed by a waveform memory 11 and a differentiation circuit 12 and the digital waveform S prestored in the waveform memory 11 is read out therefrom in synchronization with the clock $CK_0$ and fed to the differentiation circuit 12. The differentiation circuit 12 outputs, as the digital differential waveform value ΔS, a difference (i.e. a variation) of the input digital waveform data S upon each occurrence of the clock $CK_0$, for instance. The digital differential waveform ΔS thus generated by the differentiation circuit 12 is fed to the distributor 13, from which it is distributed to the digital integrators $14_1$ through $14_4$ one after another in synchronization with the clock $CK_0$. The digital-integrated outputs $A_1(t)$ through $A_4(t)$ from the integrators $14_1$ through $14_4$ are applied to D/A converting parts $DA_1$ through $DA_4$, whereby they are converted to analog signals $A_1'(t)$ through $A_4'(t)$ upon occurrence of clock signals $CK_1$ through $CK_4$, respectively. The outputs $A_1'(t)$ through $A_4'(t)$ from the D/A converting parts $DA_1$ through $DA_4$ are applied to and added together by an analog adder 16 and output therefrom as an analog waveform signal S'.

Figure 15A:
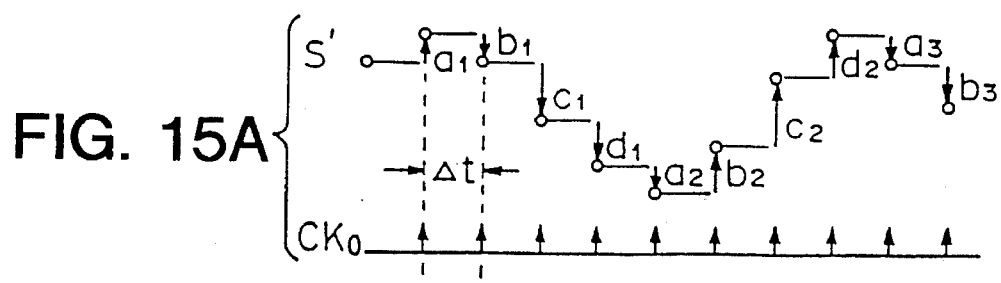
FIGS. 15A, 15B, 15C and 15D are diagrams for explaining the D/A converting operation of the FIG. 14 embodiment.
Figure 15B:
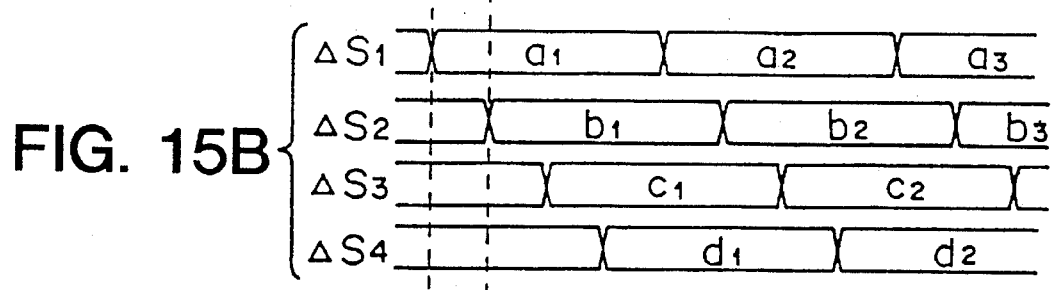

Now, inputs to and outputs from respective parts in this embodiment will be described with reference to FIG. 15. FIG. 15A shows the digital waveform S read out from the waveform memory 11 and the arrows $a_1, b_1, c_1, d_1, a_2, b_2, c_2, d_2, a_3, b_3, \ldots$ on the waveform represent the outputs ΔS from the differentiation circuit 12 that has differentiated the waveform S at the timing of the clock $CK_0$, the arrows also representing the signs of the differentiated outputs. As shown in FIG. 15B, these pieces of differentiated data are input into the integrators $14_1$ through $14_4$ one after another through the distributor 13 at the operation timing shown in FIG. 15D. The four sequences $\Delta S_1$ through $\Delta S_4$ of digital differentiated waveform data, distributed by the distributor 13, are expressed by $a_1, a_2, a_3, \ldots, b_1, b_2, b_3, \ldots, c_1, c_2, c_3, \ldots,$ and $d_1, d_2, d_3, \ldots,$ respectively, as depicted in FIG. 15B.

Figure 15C:
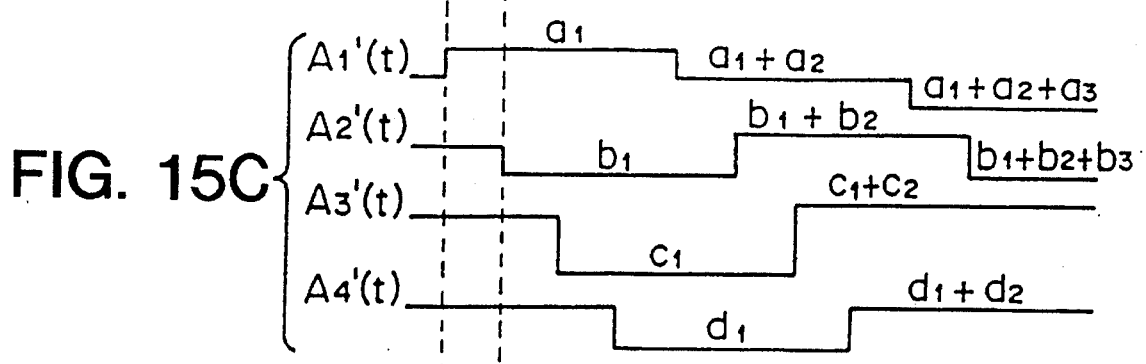
Figure 15D:
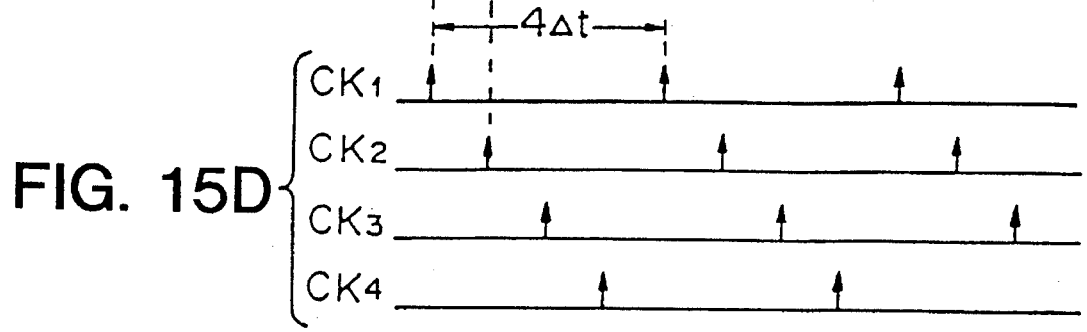

FIG. 15C shows the outputs $A_1'(t)$ through $A_4'(t)$ in the case where the pieces of differentiated data $\Delta S_1$ through $\Delta S_4$ input into the integrators $14_1$ through $14_4$ were accumulated at the timing of clock signals $CK_1$ through $CK_4$ shown in FIG. 15D and the integrator outputs were converted by the D/A converting parts $DA_1$ through $DA_4$ into digital form. The D/A converting parts $DA_1$ through $DA_4$ perform conversion at time intervals $4\Delta t$ four times longer than the cycle of the clock signal $CK_0$ and in phases displaced apart in steps of the clock cycle $\Delta t$, as shown in FIG. 15D.

The analog signals $A_1'(t)$ through $A_4'(t)$ sequentially converted by the four D/A converting parts $DA_1$ through $DA_4$ are added together by the analog adder 16, from which is obtained the analog waveform S' shown in FIG. 15A.

FIG. 16 shows an example of the analog waveform that is provided from the analog adder 16 when digital sinusoidal waveform data is read out from the waveform data memory 11. Also in this case, the maximum amplitude of the analog waveform signal S' obtained by adding the four analog signals $A_1'(t)$ through $A_4'(t)$ by the adder 16, becomes the sum of maximum amplitudes of the outputs from the respective D/A converting parts; hence, resolution is improved four times higher than the resolution obtainable with a single D/A converting part, while at the same time the gain error and the offset error between the D/A converting parts $DA_1$ through $DA_4$ are respectively reduced down to ¼. Moreover, the converting operation speed of the D/A converter in its entirety becomes four times higher than the operating speed of each D/A converting part.

It is apparent that the positions of the integrators $14_1$ through $14_4$ and the D/A converting parts $DA_1$ through $DA_4$ may be reversed in the FIG. 14 embodiment. That is, the pieces of data sequentially distributed by the distributor 13 are first converted by the D/A converting parts $DA_1$ through $DA_4$ to analog form, the analog differentiated waveforms thus obtained are integrated by the integrators $14_1$ through $14_4$ and then added by the analog adder 16.

Figure 17:
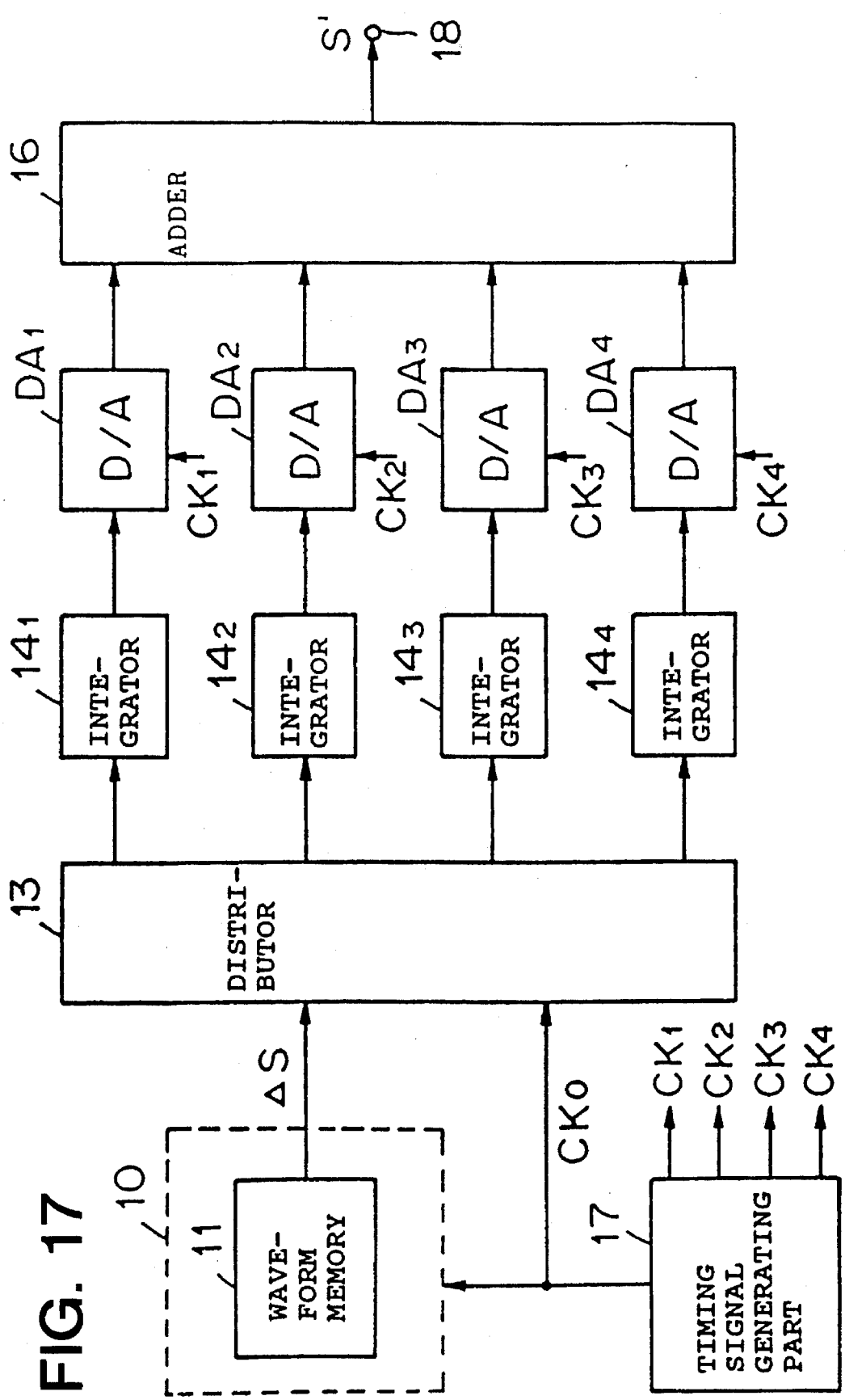
FIG. 17 is a block diagram illustrating a modified form of the FIG. 14 embodiment in which a differential waveform generating part 10 is formed by a waveform memory having stored therein differential waveforms.

Incidentally, in the FIG. 14 embodiment, since the differential waveform generating part 10 needs only to output the differential waveform data $\Delta S$, it is also possible to employ such a construction as shown in FIG. 17, in which variations of a desired waveform at regular intervals are prestored as the differential data $\Delta S$ in the waveform data memory 11 and are read out therefrom and fed to the distributor 13. In such an instance, the differentiation circuit 12 is unnecessary and the output of the memory 11 is connected to the distributor 13.

Figure 18:
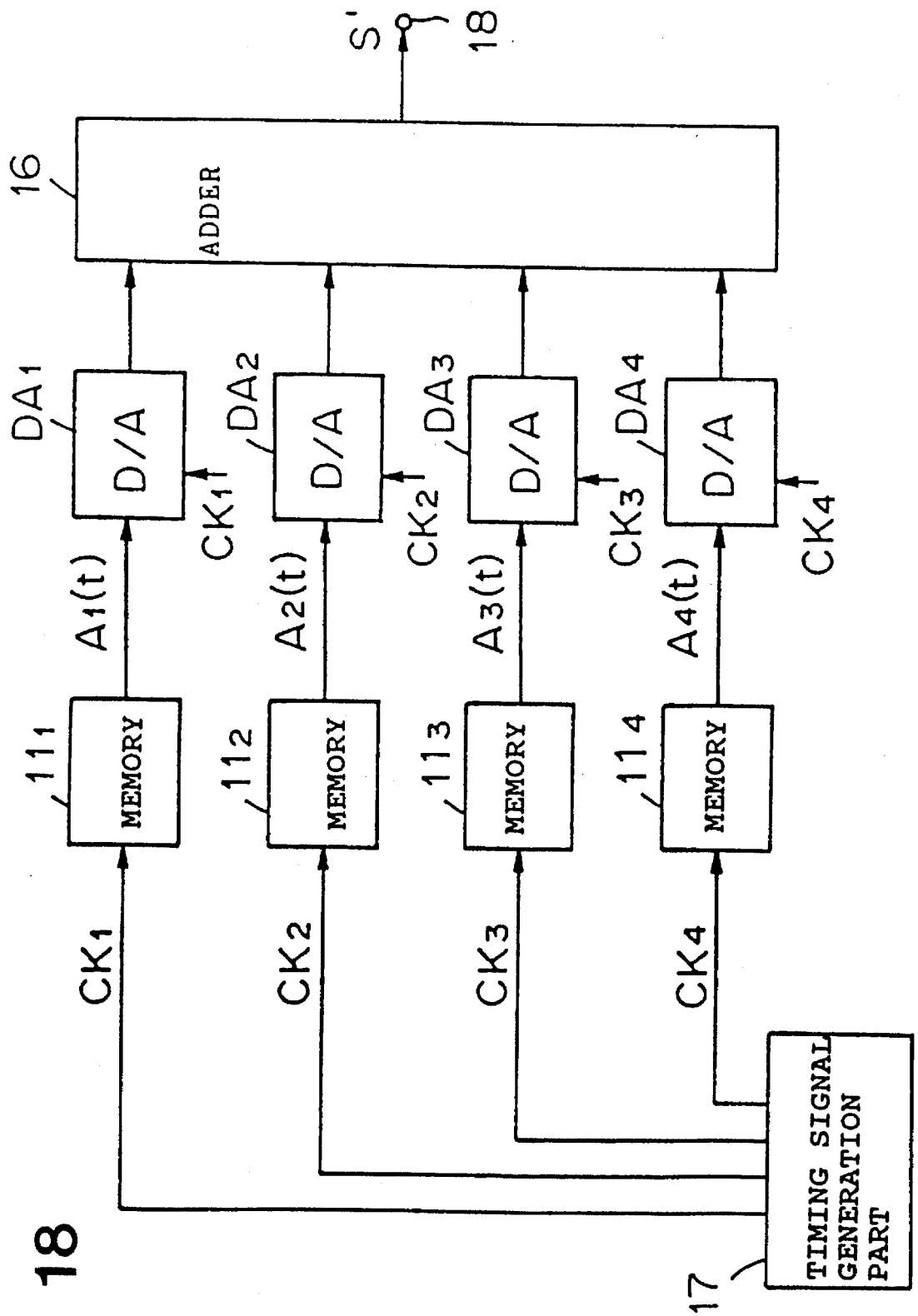
FIG. 18 is a block diagram illustrating an embodiment in which outputs from integrators $14_1$ through $14_4$ in FIG. 14 are prestored in separate waveform memories.

Moreover, when the output data $A_1(t)$ through $A_4(t)$ from the integrators $14_1$ through $14_4$ with respect to a desired waveform in the embodiment of FIG. 14 are precalculated and prestored in four waveform data memories $11_1$ through $11_4$, respectively, as shown in FIG. 18, the distributor 13 and the integrators $14_1$ through $14_4$ as well as the differentiation circuit 12 will become unnecessary. The pieces of data individually stored in the waveform data memories $11_1$ through $11_4$ are read out therefrom in a sequential order at the timing of the clock signals $CK_1$ through $CK_4$ and are D/A converted by the corresponding D/A converting parts $DA_1$ through $DA_4$, and then the converted outputs are added together in the analog adder 16.

I claim:

1. An A/D converter for waveform conversion, comprising:

differential waveform generating means for generating a differential Waveform of an analog waveform;

distributing means for distributing said differential waveform to N sequences of signals one after another, said N being an integer equal to or greater than 2;

N converting part means, each composed of a cascade connection of integrating means and A/D converting means, which are respectively supplied with said N sequences of signals and output integrated waveforms of said signals in digital form at the timing displaced in steps of a 1/N period of the distribution cycle; and adding means which adds together the outputs from said N converting part means and provides the added output as a digital waveform.

2. The converter for waveform conversion according to claim 1, wherein timing signal generating means is provided for generating N timing signals which are displaced apart in steps of a 1/N period of the distribution cycle of said distributing means.

3. The A/D converter for waveform conversion according to claim 1, wherein said differential waveform generating means is means for outputting, as said differential waveform, variations of said analog waveform at fixed periods.

4. The A/D converter for waveform conversion according to claim 1, wherein said differential waveform generating means includes primary high-pass filter means which is supplied with said analog waveform and provides its output as said differential waveform.

5. The A/D converter for waveform conversion according to claim 1, wherein said differential waveform generating means includes: delay means which delays said analog waveform for a fixed period of time; and subtracting means which is supplied at one input with said analog waveform and at the other input with the output from said delay means and outputs the difference between them as said differential waveform.

6. A D/A converter for waveform conversion, comprising:

differential waveform generating means for generating a differential waveform of a digital waveform;

distributing means for distributing said differential waveform to N sequences of signals one after another, said N being an integer equal to or greater than 2;

N converting part means, each composed of a cascade connection of integrating means and a D/A converting means, which are respectively supplied with said N sequences of signals and output integrated waveforms of said signals in analog form at the timing displaced in steps of a 1/N period of the distribution cycle; and adding means which adds together the outputs from said N converting part means and provides the added output as an analog waveform.

7. The D/A converter for waveform conversion according to claim 6, wherein said differential waveform generating means includes: waveform memory means for storing said digital waveform; and differentiating means whereby said digital waveform read out from said waveform memory means at fixed periods is differentiated and output as said differential waveform.

8. The D/A converter for waveform conversion according to claim 6, wherein said differential waveform generating means includes waveform memory means for storing variations of said digital waveform at regular intervals and outputs, as said differential waveform, said variations read out from said waveform memory means.

9. The converter for waveform conversion according to claim 6, wherein timing signal generating means is provided for generating N timing signals which are displaced apart in steps of a 1/N period of the distribution cycle of said distributing means.

10. A D/A converter for waveform conversion, comprising:

- N waveform data memory means which have stored therein pieces of waveform data obtained by integrating N sequences of differential waveform data of a digital waveform distributed in a repeating cyclic order, said N being an integer equal to or greater than 2;

- timing signal generating means which generates N timing signals for reading out said N waveform data memory means at fixed intervals and in a repeating cyclic order;

- N D/A converting means which are supplied with said pieces of waveform data read out from said N waveform data memory means and convert them to analog values; and

- adding means which are added with the outputs from said N D/A converting means and adds them together and then provides the added output as an analog waveform signal.

* * * * *